(12) United States Patent
Chang et al.

(10) Patent No.: US 11,502,228 B2
(45) Date of Patent: Nov. 15, 2022

(54) METHOD OF PRODUCING AN OPTOELECTRONIC SEMICONDUCTOR DEVICE

(71) Applicant: OSRAM Opto Semiconductors GmbH, Regensburg (DE)

(72) Inventors: Seng-Teong Chang, Balik Pulau (MY); Choon Keat Or, Ayer Itam (MY); Lee-Ying Jacqueline Ng, Bayan Lepas (MY); Chai-Yun Jade Looi, Simpang Ampat (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 8 days.

(21) Appl. No.: 16/629,422

(22) PCT Filed: Aug. 4, 2017

(86) PCT No.: PCT/EP2017/069834
§ 371 (c)(1),
(2) Date: Jan. 8, 2020

(87) PCT Pub. No.: WO2019/025009
PCT Pub. Date: Feb. 7, 2019

(65) Prior Publication Data
US 2021/0119091 A1    Apr. 22, 2021

(51) Int. Cl.
*H01L 33/56* (2010.01)
*H01S 5/02218* (2021.01)
(Continued)

(52) U.S. Cl.
CPC ............ *H01L 33/56* (2013.01); *H01L 33/501* (2013.01); *H01L 33/60* (2013.01); *H01L 33/62* (2013.01);
(Continued)

(58) Field of Classification Search
CPC . H01L 33/56; H01L 33/501; H01L 2933/005; H01L 33/005; H01S 5/02218; H01S 5/02335
See application file for complete search history.

(56) References Cited

U.S. PATENT DOCUMENTS 10,411,176 B2    9/2019  Jeon et al.
2006/0014320 A1*  1/2006  Yamano ................. H01L 24/11
                                                   438/113
(Continued)

FOREIGN PATENT DOCUMENTS

| DE | 102 45 946 | 10/2003 |
| WO | 2011/015449 | 2/2011 |
| WO | 2016/039593 | 3/2016 |

*Primary Examiner* — Feifei Yeung Lopez
(74) *Attorney, Agent, or Firm* — DLA Piper LLP (US)

(57) ABSTRACT

A method of producing an optoelectronic semiconductor device includes providing a frame part including a plurality of openings, providing an auxiliary carrier, connecting the auxiliary carrier to the frame part such that the auxiliary carrier covers at least some of the openings at an underside of the frame part, placing conversion elements onto the auxiliary carrier in at least some of the openings, placing optoelectronic semiconductor chips onto the conversion elements in at least some of the openings, applying a housing onto the conversion elements and around the semiconductor chips in at least some of the openings, and removing the frame part and the auxiliary carrier wherein a bottom surface of at least some of the optoelectronic semiconductor chips remains free of the housing.

8 Claims, 5 Drawing Sheets

(51) Int. Cl.
*H01S 5/0235* (2021.01)
*H01L 33/50* (2010.01)
*H01L 33/60* (2010.01)
*H01L 33/62* (2010.01)

(52) U.S. Cl.
CPC ........ *H01S 5/0235* (2021.01); *H01S 5/02218* (2021.01); *H01L 2933/005* (2013.01); *H01L 2933/0041* (2013.01); *H01L 2933/0058* (2013.01); *H01L 2933/0066* (2013.01); *H01L 2933/0091* (2013.01)

(56) References Cited

U.S. PATENT DOCUMENTS

| | | | |
|---|---|---|---|
| 2007/0295968 A1* | 12/2007 | Tan | H01L 33/56 257/79 |
| 2009/0068798 A1* | 3/2009 | Oliver | H01L 27/14618 438/127 |
| 2012/0119233 A1 | 5/2012 | Weidner et al. | |
| 2013/0328091 A1* | 12/2013 | Fuke | H01L 33/60 257/98 |
| 2014/0217597 A1* | 8/2014 | Lin | H01L 24/97 257/773 |
| 2016/0099387 A1 | 4/2016 | Tsutsui et al. | |
| 2017/0263837 A1* | 9/2017 | Jeon | H01L 21/67271 |

\* cited by examiner

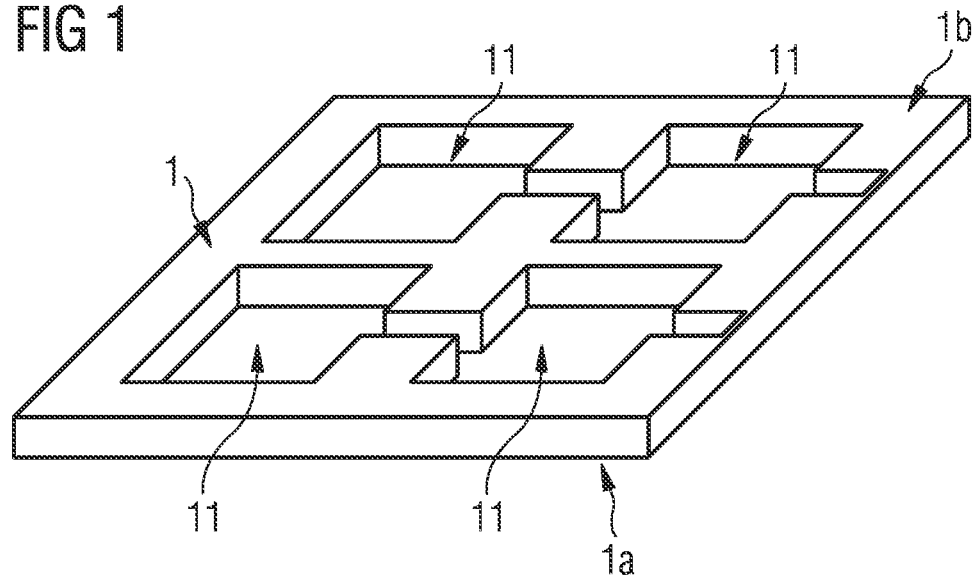
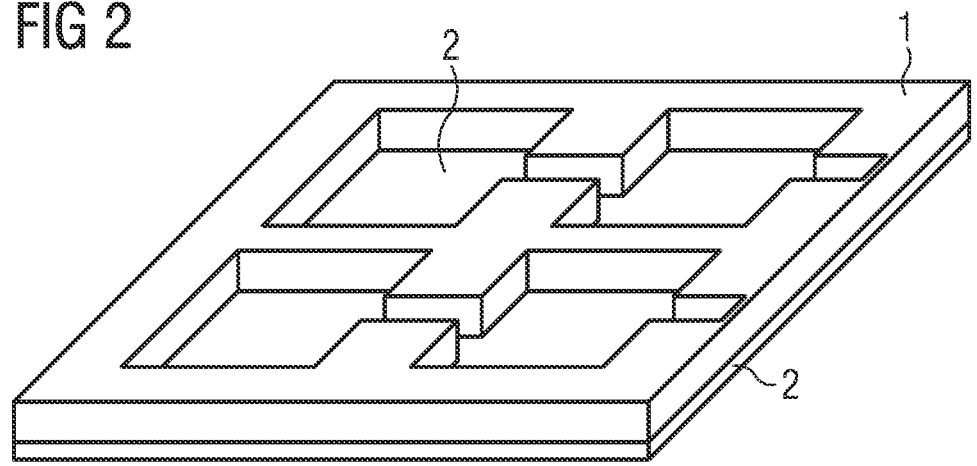

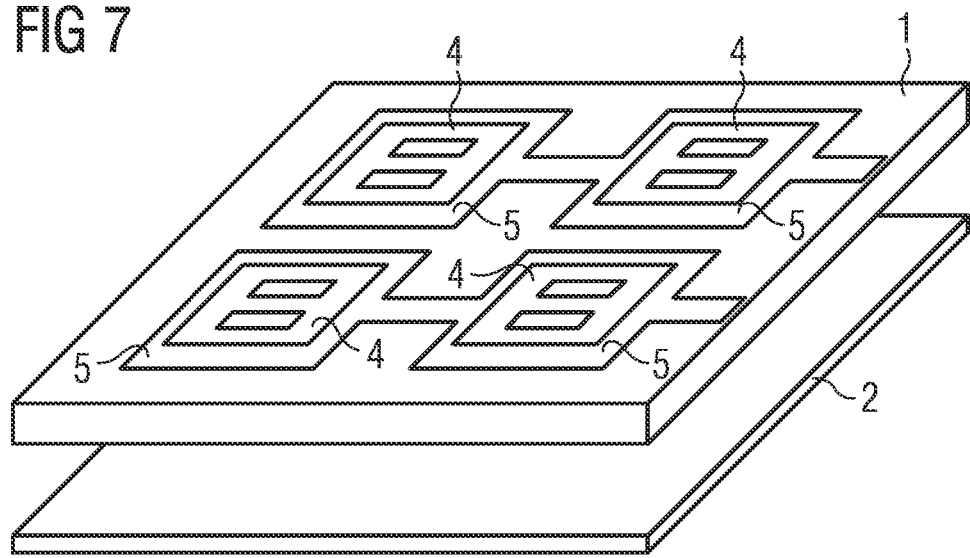
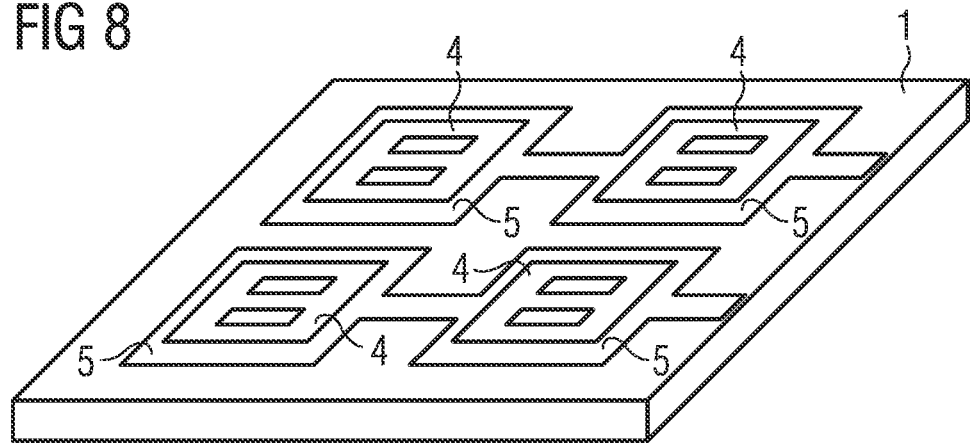

METHOD OF PRODUCING AN OPTOELECTRONIC SEMICONDUCTOR DEVICE

TECHNICAL FIELD

This disclosure relates to a method of producing an optoelectronic semiconductor device.

BACKGROUND

WO 2011/015449 A1 discloses a method of producing an optoelectronic semiconductor device. There is nonetheless a need to provide a method with which optoelectronic semiconductor devices can be produced in a particularly short time and at reduced costs.

SUMMARY

We provide a method of producing an optoelectronic semiconductor device including providing a frame part including a plurality of openings, providing an auxiliary carrier, connecting the auxiliary carrier to the frame part such that the auxiliary carrier covers at least some of the openings at an underside of the frame part, placing conversion elements onto the auxiliary carrier in at least some of the openings, placing optoelectronic semiconductor chips onto the conversion elements in at least some of the openings, applying a housing onto the conversion elements and around the semiconductor chips in at least some of the openings, and removing the frame part and the auxiliary carrier wherein a bottom surface of at least some of the optoelectronic semiconductor chips remains free of the housing.

BRIEF DESCRIPTION OF THE DRAWINGS

FIGS. 1, 2, 3, 4, 5, 6, 7, 8, 9, 10A, and 10B show schematic drawings that illustrate method steps of our method.

Figure 3:
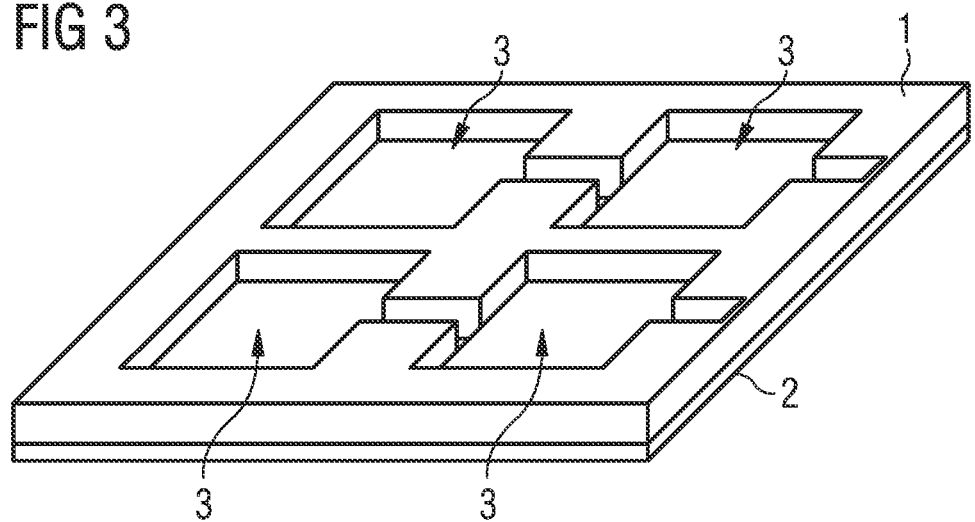

REFERENCE SIGNS 1 frame part
1a underside
1b top side
11 opening
2 auxiliary carrier
3 conversion element
4 semiconductor chip
41 contact location
42 contact location
43 bottom surface
5 housing
10 semiconductor device

DETAILED DESCRIPTION

Our method comprises a method step wherein a frame part comprising a plurality of opening is provided. The frame part is, for example, formed from a rigid material. For example, the frame part comprises a rigid material like a metal and/or a plastic material. The frame part has the shape of a cuboid, for example. The frame part comprises openings extending completely through the material of the frame part. For example, the openings are arranged at the nodes of a regular lattice, for example, a rectangular lattice. In this example, some or all of the openings have the shape of a rectangle, for example That is to say, the rim of some or all of the openings is in the shape of a rectangle.

For example, parts of the material of the frame part that abut an opening and connect the top side of an opening to its underside run crosswise or perpendicular to the plane of main extension of the frame part.

An auxiliary carrier may be provided in a further method step. The auxiliary carrier has the shape of a cuboid, for example. The auxiliary carrier can be formed from a rigid or a flexible material. In the lateral directions, which are the directions which run parallel to the plane of main extension of the frame part, the auxiliary carrier has an extension equal to or greater than the extension of the frame part. For example, the area of the auxiliary carrier in a plane parallel to the plane of main extension of the frame part is equal to or greater than the area of the frame part.

The auxiliary carrier may be connected to the frame part such that the auxiliary carrier covers at least some of the openings at an underside of the frame part. Thereby it is possible that the auxiliary carrier covers all openings of the frame part. This means that the auxiliary carrier closes the openings covered by the auxiliary carrier on one side, namely the underside of the frame part.

The auxiliary carrier and the frame part are connected to each other. For example, the auxiliary carrier and the frame part are connected by a magnetic force, a mechanical force or a chemical bond. It is, for example, possible that the auxiliary carrier and the frame part are glued to one another. However, the connection between the auxiliary carrier and the frame part can advantageously be broken at least without destroying the frame part or without destroying the frame part and the auxiliary carrier.

The method may comprise a method step in which conversion elements are placed onto the auxiliary carrier in at least some of the openings. The conversion elements comprise at least one luminescence conversion material. The luminescence conversion material is configured to absorb electromagnetic radiation of a first wavelength range and emit electromagnetic radiation of a second wavelength range. For example, the second wavelength range comprises wavelengths greater than the wavelengths of the first wavelength range. For example, it is possible with the conversion element to convert blue primary radiation to yellow secondary radiation.

The conversion elements are placed onto the auxiliary carrier in at least some of the openings. This means that a conversion element placed into one opening has an area equal to or smaller than the cross-sectional area of the opening. For example, after placing the conversion element into one opening onto the auxiliary carrier, at least 90% of the part of the auxiliary carrier placed in the opening is covered by the conversion element. Further, it is possible that the part of the auxiliary carrier in the opening is completely covered by the conversion element placed in the opening. Thereby it is possible that the conversion elements are connected with the auxiliary carrier, for example, by the same force by which the frame part is connected to the auxiliary carrier. This means that the conversion elements are glued to the auxiliary carrier, for example. Further, it is possible that the conversion elements are only put on the auxiliary carrier without connecting the conversion elements to the auxiliary carrier.

An optoelectronic semiconductor device may be placed onto the conversion element in at least some of the openings. For example, in every opening an optoelectronic semiconductor chip is placed onto the conversion element in the opening. The optoelectronic semiconductor chip is, for example, an optoelectronic semiconductor chip that emits electromagnetic radiation, for example, light during operation. For example, the optoelectronic semiconductor chip is a light-emitting diode or a laser diode. The optoelectronic semiconductor chip can be simply placed on the conversion element without a mechanical connection between the conversion element and the optoelectronic semiconductor chip. Further, it is possible that the optoelectronic semiconductor chip is connected to the conversion element by an adhesive material, for example, glue.

A housing may be placed onto the conversion elements and around the semiconductor chips and in at least some of the openings, for example, in all of the openings. The housing is formed from an electrically insulating material, for example. For example, the housing is formed from a plastic material such as, for example, an epoxy resin and/or a silicone material. The housing can comprise further materials, for example, particles that are light-scattering and/or light-reflecting or light-absorbing. This means that the housing can, for example, be reflective to the radiation produced by the optoelectronic semiconductor chip or the housing has a certain color, like black, red or blue.

The frame part and the auxiliary carrier may be removed. By removing the frame part and the auxiliary carrier single optoelectronic semiconductor devices, each comprising an optoelectronic semiconductor chip, a conversion element and a housing remain. In this way, a plurality of optoelectronic semiconductor devices is produced.

The method may comprise the following steps:
  providing a frame part comprising a plurality of openings,
  providing an auxiliary carrier,
  connecting the auxiliary carrier to the frame part such that the auxiliary carrier covers at least some of the openings at an underside of the frame part,
  placing conversion elements onto the auxiliary carrier in at least some of the openings,
  placing optoelectronic semiconductor chips onto the conversion elements in at least some of the openings,
  applying a housing onto the conversion elements and around the semiconductor chips in at least some of the openings, and
  removing the frame part and the auxiliary carrier.

These steps can be performed in the given order. In particular the placing of the conversion elements can be conducted before placing the optoelectronic semiconductor chips in the openings and before applying a housing onto the conversion elements and around the semiconductor chips.

It is possible to dispense a housing material around an optoelectronic semiconductor chip. However, the process of dispensing takes a long time and the curing necessary after dispensing the housing material also takes a long time. Furthermore, there are other handling and quality issues in connection with a dispensing process such as panel warping, volume inconsistency, creeping of the housing material to places of the optoelectronic semiconductor chip where no housing material is wanted and escaping primary radiation at the rims of the optoelectronic semiconductor chip—so-called "blue piping" for optoelectronic semiconductor chips that emit blue light as primary radiation. Other techniques for forming a housing material around optoelectronic semiconductor chips, for example, require an additional sawing process to singulate the optoelectronic semiconductor devices, which also makes the assembly process lengthy and subject to increased yield loss.

Our method, inter alia, relies on the insight that using a frame part allows, for example, molding of the housing around the optoelectronic semiconductor chips without the requirement of an additional sawing process. Further, the production of the housing and connection of the optoelectronic semiconductor chip to a conversion element can be performed in a single method step, which allows for an accelerated production of optoelectronic semiconductor devices. Due to the fact that fewer processes, for example, no sawing is needed for production of the optoelectronic semiconductor devices, less yield loss is induced because the risk of mechanically damaging the optoelectronic semiconductor devices during production is reduced.

Further, production of single units in each opening of the frame part allows, for example, production by molding in shorter periods of time as when a housing material is formed around a plurality of semiconductor chips by dispensing or molding. Further, material and process variations in terms of total package thickness are overcome by the described method. This means that the optoelectronic semiconductor devices, for example, show a well-defined layer thickness that does not fluctuate or hardly fluctuates. Further, cracks in the housing due to the variation in total thickness of the housing are minimized by minimizing the stress induced otherwise due to warping or sawing. In conclusion, the described method allows for shorter process times and a cheaper production of the optoelectronic semiconductor devices.

The auxiliary carrier may comprise an adhesive tape having heat-releasing properties. It is possible that the adhesive tape is placed on the top side of a base body of the auxiliary carrier facing away from the frame part. Further, it is possible that the auxiliary carrier consists of an adhesive tape having heat-releasing properties. Due to the heat-releasing properties, it is possible in a later method step to release the tape from the frame part and the conversion element by heating.

The frame part may be a waffle pack. This means that the frame part is formed with a material having the shape of a cuboid and into which openings that completely penetrate through the material are placed at the knots of a rectangular lattice, and the rims of the openings have the shape of rectangles. Each opening may have the same shape and the same cross-sectional area. With such a frame part it is possible to produce a large number of optoelectronic semiconductor devices that are similar in shape and size.

At least one of the conversion elements may comprise a B-stage or uncured silicone base material. For example, all conversion elements comprise the B-stage silicone base material. For example, particles of a luminescence conversion material are introduced into the base material. The usage of a B-stage silicone base material has the advantage that the thus formed conversion elements are sticky before curing. In this way, the conversion elements adhere to the auxiliary carrier, and the optoelectronic semiconductor chip placed on such a conversion element adheres to the conversion element without the need for a further adhesive material such as, for example, a glue.

The housing may be applied by compression molding. For example, the housing comprises a silicone material in the shape of pellets applied around the optoelectronic semiconductor chips by compression molding.

The housing material may comprise particles of $TiO_2$ and $SiO_2$ in a silicone base material. For example, pellets comprising these particles and silicone are provided for applying the housing onto the conversion elements and around the semiconductor chips by compression molding. In this way a housing can be produced which is reflective and, for example, has a white appearance. Radiation produced during operation of the optoelectronic semiconductor chip that leaves the optoelectronic chips through side faces which abut the housing, is reflected by the housing into the optoelectronic semiconductor chip and, for example, leaves the optoelectronic semiconductor chip through the top surface which abuts the conversion element.

The combined thickness of one of the conversion elements and one of the optoelectronic semiconductor chips placed on the conversion element may be at least the thickness of the frame part e.g. in a region abutting the opening into which the optoelectronic semiconductor chip and the conversion element are placed. In this way, it is possible that on a side facing away from the conversion element the optoelectronic semiconductor chip is flush with the frame part or the semiconductor chip protrudes over the frame part on a side of the frame part facing away from the auxiliary carrier. In this way it is particularly easy to produce an optoelectronic semiconductor device in which the optoelectronic semiconductor chip has a bottom surface facing away from the conversion element which is not covered by a material of the housing.

At least some of the optoelectronic semiconductor chips, for example, all of the optoelectronic semiconductor chips comprise contact locations for electrically contacting the optoelectronic semiconductor chips arranged at a bottom surface facing away from the conversion element. In this way, it is possible that the optoelectronic semiconductor chips are surface-mountable. For example, the optoelectronic semiconductor chips can be so-called flip-chip s.

The bottom surface of at least some of the optoelectronic semiconductor chips may remain free of the housing. This means that the housing is applied around the optoelectronic semiconductor chips such that the bottom surface of the optoelectronic semiconductor chips, for example, of all optoelectronic semiconductor chips, remains free of the housing material. In this way it is not necessary to remove the housing material afterwards, which allows for a particularly fast and cost-saving production of the optoelectronic semiconductor devices.

Curing the housing material, the curing of the conversion element, which comprises, for example, a B-stage silicone material, and the releasing of the auxiliary carrier may be conducted by heating during the same method step. This means that the material of the auxiliary carrier, the material of the housing and the material of the conversion element are chosen such that curing of the conversion element and the housing and releasing the auxiliary carrier can be completed by heat within the same temperature range. This allows for a particularly easy and fast production of the optoelectronic semiconductor devices as all three method steps can be performed during a single heating of the arrangement comprising the auxiliary carrier, the frame part, the conversion element and the housing.

The conversion element may completely cover the auxiliary carrier in the region of the opening into which the conversion element is placed. Due to this fact, the housing material does not cover the side surface or the top surface of the conversion element facing away from the optoelectronic semiconductor chip, and in the finished optoelectronic semiconductor device only the conversion element, not the housing material, is visible in top view.

In the following the method described herein is further explained with respect to schematic drawings which illustrate method steps of an example of the described method.

In the examples and figures, similar or similarly acting constituent parts are provided with the same reference symbols. The elements illustrated in the figures and their proportions in relation to one another should not be regarded as true to scale. Rather, individual elements may be represented with an exaggerated size for the sake of better representability and/or for the sake of better understanding.

In a first method step shown in FIG. 1, a frame part 1 is provided. The frame part 1 comprises a base material into which a plurality of openings 11 are formed. For example, the frame part 1 is a waffle pack comprising a plurality of openings 11 that are through-holes. The dimension of the openings 11 is customized to the size of the optoelectronic semiconductor device to be produced and the area of the frame part 1 is determined according to the molding capacity and capability of the used machines. For example, the frame part 1 comprises or consists of a plastic material such as Teflon® or consist of a metal material such as steel. The frame part 1 is recyclable and can be used multiple times for producing optoelectronic semiconductor devices.

In a second method step shown in FIG. 2, an auxiliary carrier 2, for example, an adhesive tape is placed on the underside 1a of the frame part 1. By this attaching of auxiliary carrier 2 pockets of a cavity are produced. For example, the auxiliary carrier 2 comprises a heat-releasing tape which loses its adhesiveness upon heating.

In a next method step shown in FIG. 3, conversion elements 3 are picked and placed into the openings 11 of the frame part 1 on the top side of the auxiliary carrier 2 facing the frame part 1. The conversion elements 3 comprise a B-stage silicone material, for example. The size and the shape of the conversion element 3 are, for example, exactly the size and shape of the openings 11 in the frame part 1 and the size and shape of the optoelectronic semiconductor device produced by the described method.

Figure 4:
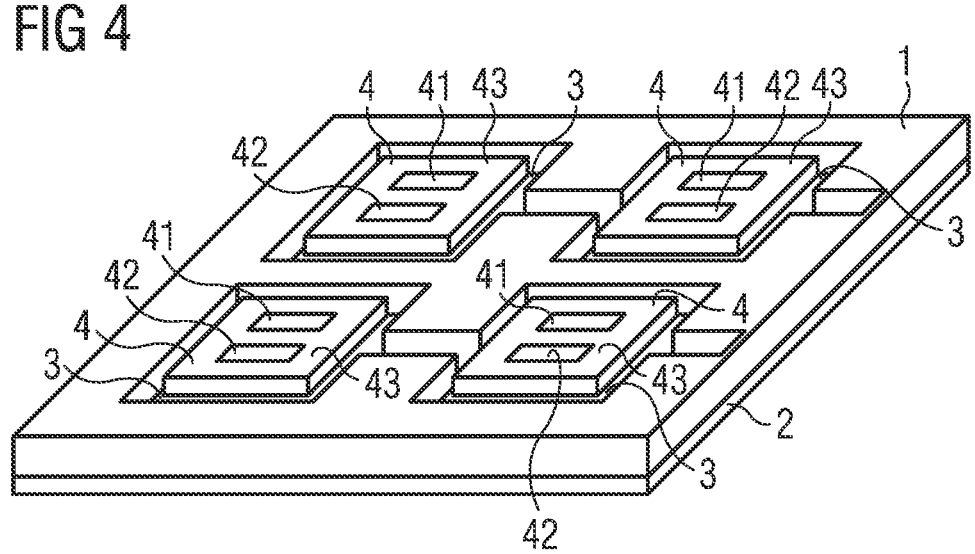

In connection with FIG. 4 a further method step is shown in which optoelectronic semiconductor chips 4 are picked and placed into the openings 11. Each optoelectronic semiconductor chip is placed with its top surface, through which electromagnetic radiation is emitted during operation, towards the conversion elements 3. At the bottom surface 43 contact locations 41 and 42 for electrically contacting the optoelectronic semiconductor chips are arranged. The size of each optoelectronic semiconductor chip is smaller than the size of the openings 11 and thus there is some empty space surrounding each optoelectronic semiconductor chip.

Figure 5:
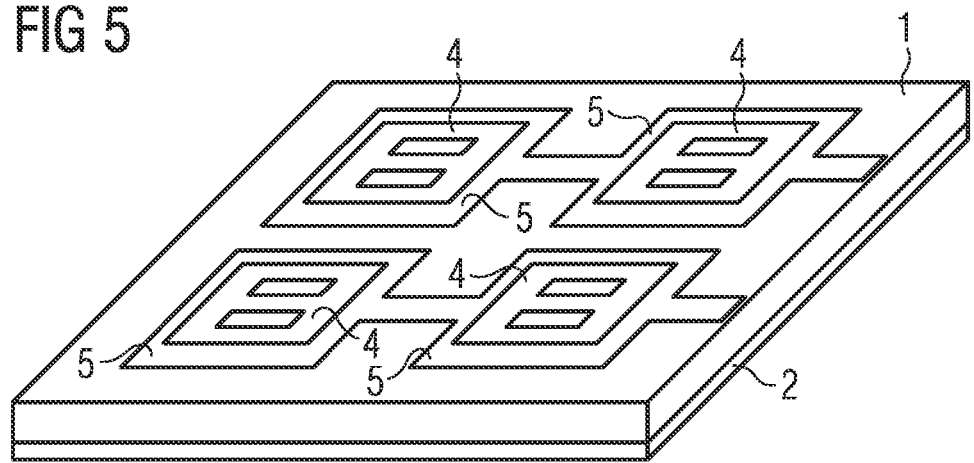

In the next method step shown in FIG. 5, a housing material 5 is applied, for example, by molding or pellets comprising $TiO_2$, $SiO_2$ and a silicone material.

Figure 6:
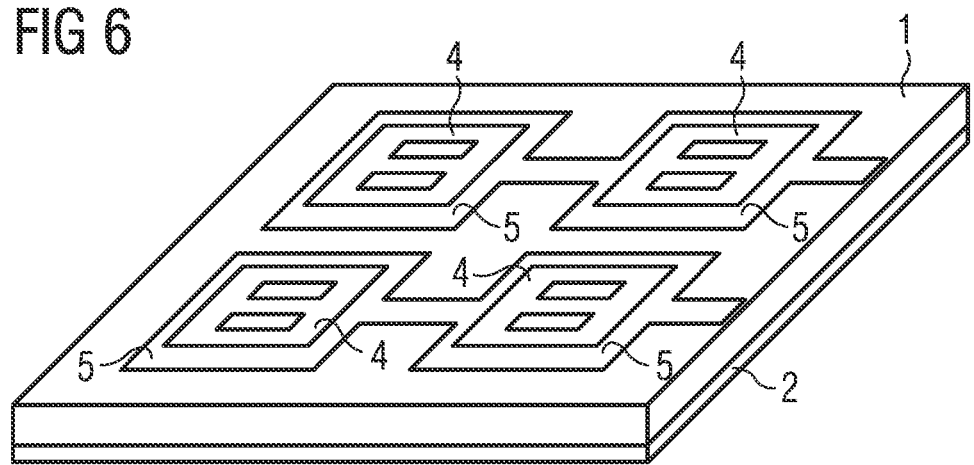

After application of the housing material around each optoelectronic semiconductor chip, degating by the molding machine and then a laser de-flashing for any mold flashes onto the optoelectronic semiconductor chips during molding are performed. This is illustrated in FIG. 6.

In the next method step shown in FIG. 7, detaping is performed to release the auxiliary carrier 2. For example, when a heat-releasing tape is used as an auxiliary carrier 2, after molding and curing of the housing 5 the auxiliary carrier 2 no longer adheres to the conversion element 3 and the frame part 1, which allows a simple detaping to release the auxiliary carrier 2.

This results in the arrangement of FIG. 8 consisting of the frame part 1, the housing 5, the semiconductor chips 4 and the conversion elements 3.

Figure 9:
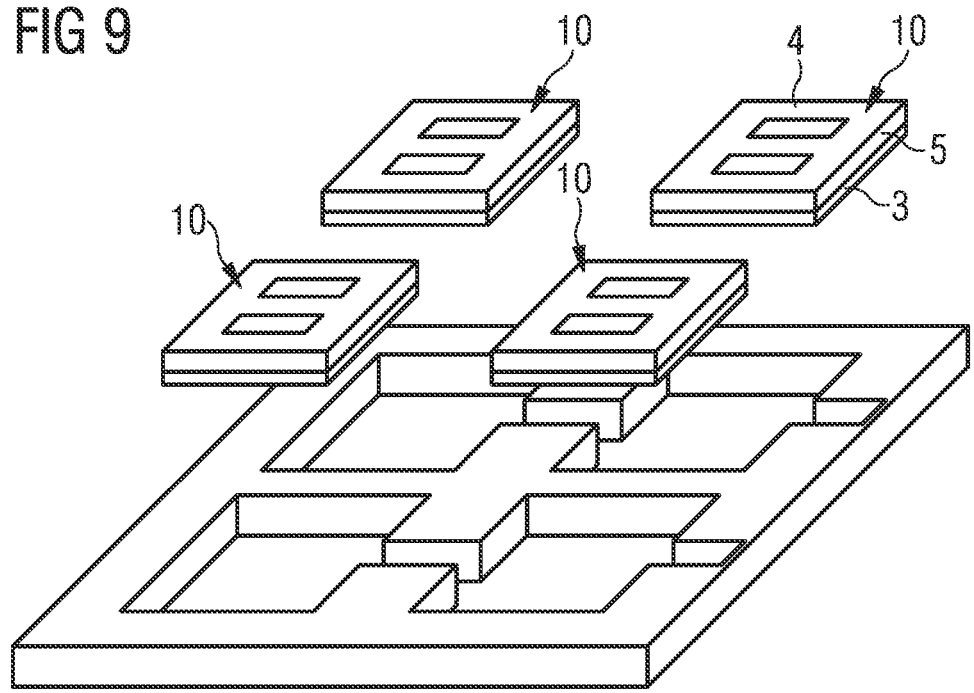

In a next method step shown in FIG. 9, the single optoelectronic semiconductor devices are released from the frame part 1, for example, by using a rubber pin to release the devices from the bottom surface 43 of the optoelectronic semiconductor chips.

Figure 10A:
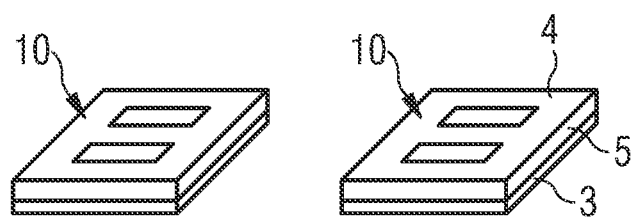
Figure 10B:
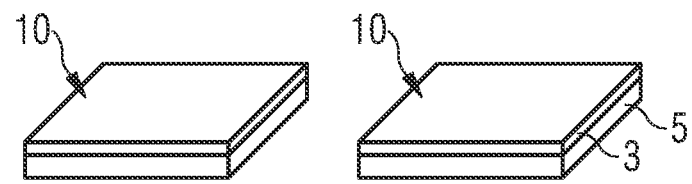

The method results in a plurality of optoelectronic semiconductor devices as shown, for example, in FIG. 10A from the bottom surface 43 of the optoelectronic semiconductor chips 4 or in FIG. 10B from the top side, which is completely covered by the conversion element 3.

Our methods are not restricted to the examples by the description on the basis of the examples. Rather, this disclosure encompasses any new feature and also any combination of features, which in particular comprises any combination of features in the appended claims and any combination of features in the examples, even if the feature or combination itself is not explicitly specified in the claims or examples.

The invention claimed is:

1. A method of producing an optoelectronic semiconductor device comprising:
    providing a frame part comprising a plurality of openings,
    providing an auxiliary carrier,
    connecting the auxiliary carrier to the frame part such that the auxiliary carrier covers at least some of the openings at an underside of the frame part,
    after placing conversion elements onto the auxiliary carrier in at least some of the openings place optoelectronic semiconductor chips onto the conversion elements in at least some of the openings,
    applying a housing onto the conversion elements and around the semiconductor chips in at least some of the openings, and
    removing the frame part and the auxiliary carrier,
    wherein a bottom surface of at least some of the optoelectronic semiconductor chips remains completely free of the housing throughout an entire fabrication process,
    the optoelectronic semiconductor chips comprise contact locations arranged at the bottom surface that electrically contact the optoelectronic semiconductor chips,
    the conversion elements cover a top surface of at least some of the optoelectronic semiconductor chips, through which electromagnetic radiation is emitted during operation,
    the top surface is opposite to the bottom surface of the optoelectronic semiconductor chip, and
    an area of the conversion element is smaller than a cross-sectional area of the opening such that a part of the auxiliary carrier in the opening is not covered by the conversion element.

2. The method according to claim 1, wherein the auxiliary carrier comprises an adhesive tape having heat-releasing properties.

3. The method according to claim 1, wherein the frame part is a waffle pack.

4. The method according to claim 1, wherein at least one of the conversion elements comprises a B-stage silicone base material.

5. The method according to claim 1, wherein the housing is applied by compression molding.

6. The method according to claim 1, wherein the housing comprises particles of $TiO_2$ and $SiO_2$ in a silicone base material.

7. The method according to claim 1, wherein a combined thickness of one of the conversion elements and one of the optoelectronic semiconductor chips placed on said conversion element is at least the thickness of the frame part.

8. A method of producing an optoelectronic semiconductor device comprising:
    providing a frame part comprising a plurality of openings,
    providing an auxiliary carrier,
    connecting the auxiliary carrier to the frame part such that the auxiliary carrier covers at least some of the openings at an underside of the frame part,
    placing conversion elements onto the auxiliary carrier in at least some of the openings,
    placing optoelectronic semiconductor chips onto the conversion elements in at least some of the openings,
    applying a housing onto the conversion elements and around the semiconductor chips in at least some of the openings, and
    removing the frame part and the auxiliary carrier,
    wherein a bottom surface of at least some of the optoelectronic semiconductor chips remains completely free of the housing throughout an entire fabrication process,
    the optoelectronic semiconductor chips comprise contact locations arranged at the bottom surface that electrically contact the optoelectronic semiconductor chips,
    the conversion elements cover a top surface of at least some of the optoelectronic semiconductor chips, through which electromagnetic radiation is emitted during operation,
    the top surface is opposite to the bottom surface of the optoelectronic semiconductor chip, and
    an area of the conversion element is smaller than a cross-sectional area of the opening and the conversion elements are picked and placed into the openings.

* * * * *